(12) United States Patent
Guo et al.

(10) Patent No.: US 12,243,746 B2
(45) Date of Patent: Mar. 4, 2025

(54) METHOD FOR STRIPPING GALLIUM NITRIDE SUBSTRATE

(71) Applicant: SUZHOU METABRAIN INTELLIGENT TECHNOLOGY CO., LTD., Jiangsu (CN)

(72) Inventors: Fen Guo, Jiangsu (CN); Kang Su, Jiangsu (CN); Hongtao Man, Jiangsu (CN); Tuo Li, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/697,445

(22) PCT Filed: Sep. 29, 2022

(86) PCT No.: PCT/CN2022/122735
§ 371 (c)(1),
(2) Date: Mar. 29, 2024

(87) PCT Pub. No.: WO2023/159951
PCT Pub. Date: Aug. 31, 2023

(65) Prior Publication Data
US 2024/0332021 A1    Oct. 3, 2024

(30) Foreign Application Priority Data

Feb. 22, 2022 (CN) .......... 202210159444.4

(51) Int. Cl.
*H01L 21/268* (2006.01)
*C30B 25/20* (2006.01)
(Continued)

(52) U.S. Cl.
CPC ............ *H01L 21/268* (2013.01); *C30B 25/20* (2013.01); *C30B 29/406* (2013.01); *C30B 33/04* (2013.01);
(Continued)

(58) Field of Classification Search
None
See application file for complete search history.

(56) References Cited

U.S. PATENT DOCUMENTS

| 7,998,836 B1 | 8/2011 | Shiomi |
| 2010/0148188 A1* | 6/2010 | Knollenberg ....... H01L 33/0075 438/33 |

FOREIGN PATENT DOCUMENTS

| CN | 102140680 A | 8/2011 |
| CN | 105006446 A | 10/2015 |

(Continued)

OTHER PUBLICATIONS

Alshahed, et al., "600V, Low-Leakage AlGaN/GaN MIS-HEMT on Bulk GaN Substrates", European Solid-State Device Research Conference (ESSDERC).
(Continued)

*Primary Examiner* — Hsien Ming Lee
(74) *Attorney, Agent, or Firm* — Merchant & Gould P.C.

(57) ABSTRACT

Disclosed is a method for stripping a gallium nitride substrate, including: a gallium nitride substrate with a gallium nitride epitaxial structure directly grown on an upper surface thereof is acquired; an interior of the gallium nitride substrate is scanned and irradiated via the epitaxial structure by a laser beam, so as to generate a decomposition layer in the gallium nitride substrate, the laser beam being a laser having a pulse width on the order of less than $10^{-15}$ s, and a distance between the decomposition layer and the upper surface of the gallium nitride substrate being less than a thickness of
(Continued)

the gallium nitride substrate; and the gallium nitride substrate is separated at the decomposition layer, so as to obtain a stripped gallium nitride substrate and a semiconductor device.

20 Claims, 2 Drawing Sheets

(51) Int. Cl.
    *C30B 29/40*     (2006.01)
    *C30B 33/04*     (2006.01)
    *H01L 21/02*     (2006.01)
    *H01L 21/304*     (2006.01)
    *H01L 21/306*     (2006.01)
    *H01L 29/66*     (2006.01)

(52) U.S. Cl.
    CPC .... *H01L 21/02389* (2013.01); *H01L 21/0254* (2013.01); *H01L 21/3043* (2013.01); *H01L 21/30625* (2013.01); *H01L 29/66462* (2013.01)

(56) References Cited

FOREIGN PATENT DOCUMENTS

| | | |
|---|---|---|
| CN | 112397571 A | 2/2021 |
| CN | 114220740 A | 3/2022 |
| JP | 2018165225 A | 10/2018 |

OTHER PUBLICATIONS

International Search Report and Written Opinion received for PCT Serial No. PCT/CN2022/122735 on Nov. 30, 2022, 12 pgs.
Chinese Search Report received for CN Serial No. 2022101594444 on Mar. 23, 2022, 3 pgs.

\* cited by examiner

METHOD FOR STRIPPING GALLIUM NITRIDE SUBSTRATE

CROSS-REFERENCE TO RELATED APPLICATIONS

The present application is a National Stage Application of PCT International Application No.: PCT/CN2022/122735 filed on Sep. 29, 2022, which claims priority to Chinese Patent Application 202210159444.4, filed in the China National Intellectual Property Administration on Feb. 22, 2022, the disclosure of which is incorporated herein by reference in its entirety.

TECHNICAL FIELD

The present disclosure relates to the field of semiconductors, and in particular to a method for stripping a gallium nitride substrate.

BACKGROUND

Gallium nitride, as a typical representative of a third generation wide band gap semiconductor, has excellent physical and chemical properties, and has a band gap width, an electron saturation migration speed, a breakdown voltage and an operating temperature far greater than Si and GaAs, and is very suitable for developing high-frequency, high-voltage and high-power devices and circuits. The production scale of gallium nitride substrates is small, and currently, the gallium nitride substrates are only available from a few companies, and are expensive. When an epitaxial structure is manufactured, the epitaxial structure is directly grown on a gallium nitride substrate to obtain a semiconductor device. Since the cost of the gallium nitride substrate is high, the cost of the semiconductor device is high.

Therefore, how to reduce the cost of the gallium nitride substrate should be a technical problem to be urgently solved by a person skilled in the art.

SUMMARY

Some embodiments of the present disclosure provide a method for stripping a gallium nitride substrate, including:
a gallium nitride substrate with a gallium nitride epitaxial structure directly grown on an upper surface thereof is acquired;
an interior of the gallium nitride substrate is scanned and irradiated via the gallium nitride epitaxial structure by a laser beam, so as to generate a decomposition layer in the gallium nitride substrate, the laser beam being a laser having a pulse width on the order of less than $10^{-15}$ s, and a distance between the decomposition layer and the upper surface of the gallium nitride substrate being less than a thickness of the gallium nitride substrate; and
the gallium nitride substrate is separated at the decomposition layer, so as to obtain a stripped gallium nitride substrate and a semiconductor device.

In some embodiments, before the interior of the gallium nitride substrate is scanned and irradiated via the gallium nitride epitaxial structure by the laser beam, the method further includes:
the gallium nitride epitaxial structure and the gallium nitride substrate are grooved by a laser grooving technique to form grooves, depths of the grooves being equal to the distance between the decomposition layer and the upper surface of the gallium nitride epitaxial structure.

In some embodiments, the grooves are distributed in a grid.

In some embodiments, after the stripped gallium nitride substrate and the semiconductor device are obtained, the method further includes:
a separated surface of the stripped gallium nitride substrate is polished.

In some embodiments, the gallium nitride substrate is separated at the decomposition layer includes:
the upper surface of the gallium nitride epitaxial structure is bonded to a carrier; and
opposing forces are applied to the carrier and the gallium nitride substrate, so that the gallium nitride substrate is separated at the decomposition layer.

In some embodiments, a wavelength of the laser beam is between 1000 nm and 1040 nm, pulse energy of the laser beam is between 3 µJ and 5 µJ, a pulse repetition rate of the laser beam is between 1 kHz and 2 kHz, and a scanning speed of the laser beam is between 500 µm/s and 1000 µm/s.

In some embodiments, before the gallium nitride substrate with the gallium nitride epitaxial structure directly grown on the upper surface thereof is acquired, the method further includes:
the gallium nitride epitaxial structure is grown on the upper surface of the gallium nitride substrate.

In some embodiments, under the condition of scanning and irradiating the gallium nitride substrate, the laser beam scans and irradiates the interior of the gallium nitride substrate in a continuous track.

In some embodiments, under the condition of scanning and irradiating the gallium nitride substrate, the laser beam scans and irradiates the interior of the gallium nitride substrate in a plurality of intermittent tracks.

Some embodiments of the present disclosure provide a method for stripping a gallium nitride substrate, including: a gallium nitride substrate with a gallium nitride epitaxial structure directly grown on an upper surface thereof is acquired; an interior of the gallium nitride substrate is scanned and irradiated via the epitaxial structure by a laser beam, so as to generate a decomposition layer in the gallium nitride substrate, the laser beam being a laser having a pulse width on the order of less than $10^{-15}$ s, and a distance between the decomposition layer and the upper surface of the gallium nitride substrate being less than a thickness of the gallium nitride substrate; and the gallium nitride substrate is separated at the decomposition layer, so as to obtain a stripped gallium nitride substrate and a semiconductor device.

BRIEF DESCRIPTION OF THE DRAWINGS

In order to describe the technical solutions in the embodiments of the present disclosure or in the related art more clearly, hereinafter, accompanying drawings requiring to be used for describing the embodiments or the related art are introduced briefly. Apparently, the accompanying drawings in the following description merely relate to some embodiments of the present disclosure, and for a person of ordinary skill in the art, other embodiments may also be derived from these accompanying drawings without involving any inventive effort.

DETAILED DESCRIPTION OF THE EMBODIMENTS

To make a person skilled in the art better understand the solutions of the present disclosure, hereinafter, some embodiments of the present disclosure are further described in detail with reference to the accompanying drawings and specific implementations. Apparently, the embodiments as described are merely some rather than all of the embodiments of the present disclosure. All other embodiments obtained by a person of ordinary skill in the art on the basis of the embodiments of the present disclosure without involving any inventive effort all fall within the scope of protection of the present disclosure.

In the following description, numerous specific details are set forth in order to provide a thorough understanding of some embodiments of the present disclosure. However, the present disclosure may also be implemented in other manners different from those described herein. A person skilled in the art may make similar generalizations without departing from the content of the present disclosure. Therefore, the present disclosure is not limited to the specific embodiments disclosed below.

As mentioned in the Background, currently, when a semiconductor device is manufactured by a gallium nitride substrate, an epitaxial structure is directly grown on the gallium nitride substrate. Gallium nitride substrates are available from only a few companies, and are expensive.

Figure 1:
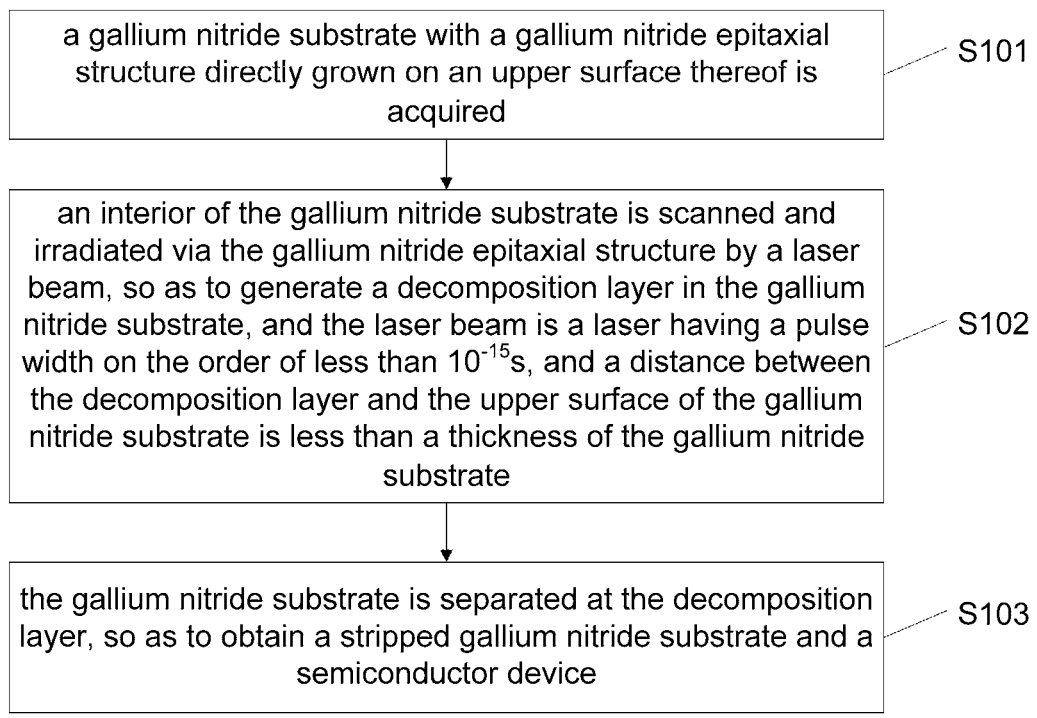
FIG. 1 is a flowchart of a method for stripping a gallium nitride substrate provided according to embodiments of the present disclosure.

In view of this, some embodiments of the present disclosure provide a method for stripping a gallium nitride substrate. Referring to FIG. 1, the method includes:

step S101: a gallium nitride substrate with a gallium nitride epitaxial structure directly grown on an upper surface thereof is acquired.

The gallium nitride epitaxial structure is a homoepitaxial structure of the gallium nitride substrate. Compared with a heteroepitaxial structure, the homoepitaxial structure may enable an AlGaN/GaN heterojunction material to obtain better crystalline quality and less internal stress. The gallium nitride substrate may enable the resulting semiconductor device to have higher mobility, high average electron speed and high radio frequency performance.

Step S102: an interior of the gallium nitride substrate is scanned and irradiated via the gallium nitride epitaxial structure by a laser beam, so as to generate a decomposition layer in the gallium nitride substrate, and the laser beam is a laser having a pulse width on the order of less than $10^{-15}$ s, and a distance between the decomposition layer and the upper surface of the gallium nitride substrate is less than a thickness of the gallium nitride substrate.

The laser beam is the laser having the pulse width on the order of less than $10^{-15}$ s. The laser beam enters the interior of the gallium nitride substrate via the gallium nitride epitaxial structure, that is, a focus of the laser beam is focused on the interior of the gallium nitride substrate. An ultrashort laser pulse focused on the interior of the gallium nitride substrate causes a thermal decomposition effect of gallium nitride, producing a gallium decomposition layer and nitrogen. At the same time, the use of the laser beam may also reduce thermally affected zones and corresponding damage to surrounding materials. The laser beam may be a femtosecond laser beam.

The decomposition layer is a continuous decomposition layer. The distance between the decomposition layer and the upper surface of the gallium nitride substrate, i.e. the distance between the focus of the laser beam and the upper surface of the gallium nitride substrate, needs to be less than the thickness of the gallium nitride substrate due to the need to strip the gallium nitride substrate; and at the same time, the stripped gallium nitride substrate needs to be reused, so that the thickness thereof must be self-supporting, and the thickness of the stripped gallium nitride substrate also needs to be greater than 150 microns. The thickness of the gallium nitride substrate is generally about 500 microns.

It should be noted that the distance between the decomposition layer and the upper surface of the gallium nitride substrate is not limited in some embodiments of the present disclosure, and may be set on his/her own initiative. For example, the distance between the decomposition layer and the upper surface of the gallium nitride substrate is between 4 μm and 6 μm.

A wavelength of the laser beam is between 1000 nm and 1040 nm, pulse energy of the laser beam is between 3 μJ and 5 μJ, a pulse repetition rate of the laser beam is between 1 kHz and 2 kHz, and a scanning speed of the laser beam is between 500 μm/s and 1000 μm/s.

During the scanning process of the laser beam, the focus of the laser beam needs to be parallel to the upper surface of the gallium nitride substrate, so that the thicknesses of the stripped gallium nitride substrate and the gallium nitride substrate in the semiconductor device are uniform.

Figure 2:
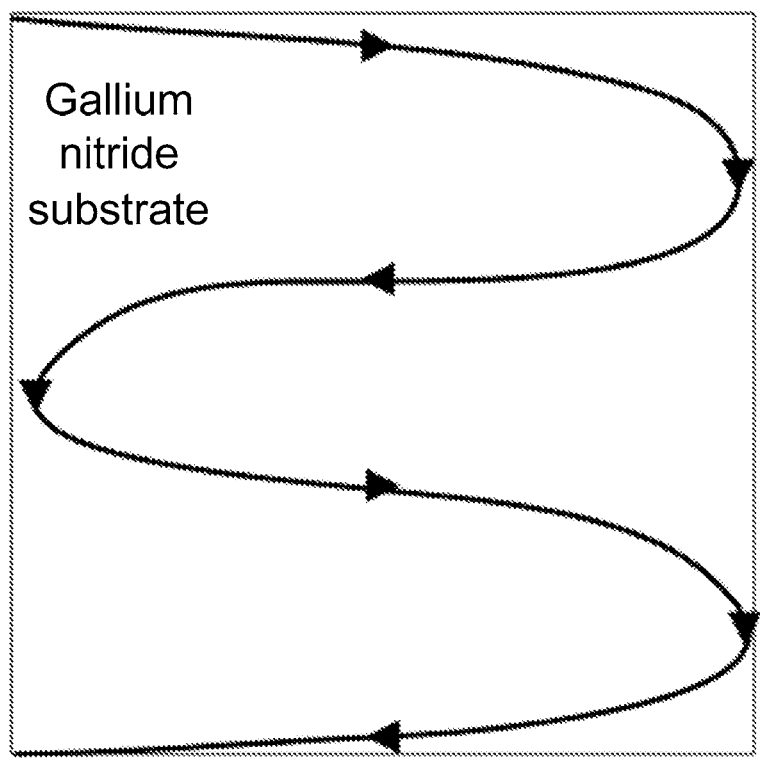
FIGS. 2 and 3 are schematic diagrams of scanning paths of a laser beam on a gallium nitride substrate.
Figure 3:
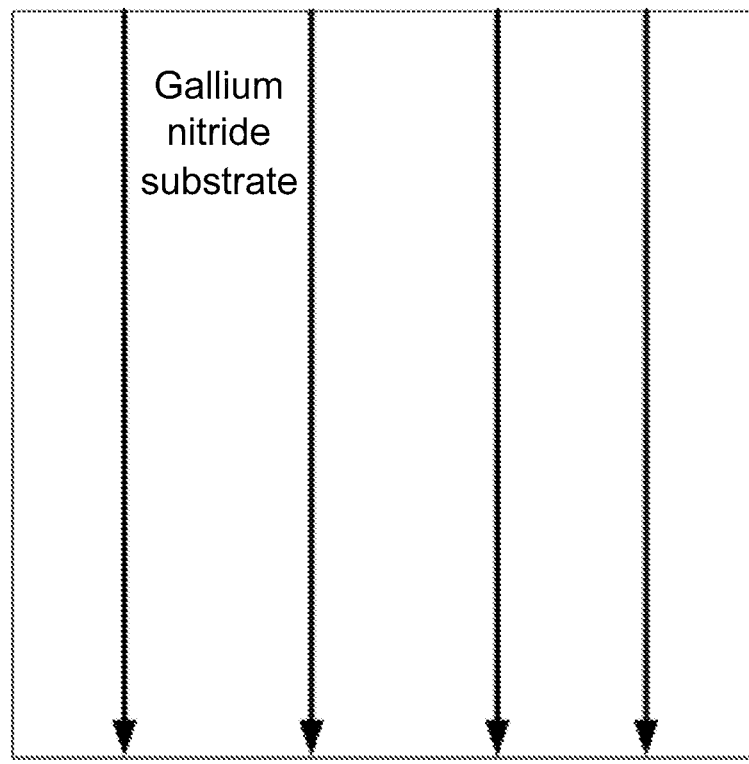

In some embodiments, under the condition of scanning and irradiating the gallium nitride substrate, the laser beam scans and irradiates the interior of the gallium nitride substrate in a continuous track, for example, the laser beam scans and irradiates the interior of the gallium nitride substrate in an S-shaped track, the scanning track is shown in FIG. 2, or the laser beam scans and irradiates the interior of the gallium nitride substrate in a spiral track, so as to achieve continuous scanning of the gallium nitride substrate, and a laser is turned off after the scanning is finished. However, there is no limitation thereto in some embodiments of the present application. In other embodiments, under the condition of scanning and irradiating the gallium nitride substrate, the laser beam scans and irradiates the interior of the gallium nitride substrate in a plurality of intermittent tracks, for example, the laser beam scans the gallium nitride substrate multiple times in a length direction or a width direction of the gallium nitride substrate, the scanning tracks is shown in FIG. 3. In such a scanning manner, a laser needs to be turned off after scanning in each individual track is finished, and is then turned on to perform next scanning until scanning of the gallium nitride substrate is finished.

Step S103: the gallium nitride substrate is separated at the decomposition layer, so as to obtain a stripped gallium nitride substrate and a semiconductor device.

In some embodiments, the gallium nitride substrate is separated at the decomposition layer includes:

the upper surface of the gallium nitride epitaxial structure is bonded to a carrier; and opposing forces are applied to the carrier and the gallium nitride substrate, so that the gallium nitride substrate is separated at the decomposition layer.

The bonding process may be: an upper surface of the carrier is coated with an adhesive material acting as a bonding material, then the upper surface of the gallium nitride epitaxial structure is bonded to the upper surface of the carrier sheet, and a certain temperature and pressure are applied to achieve bonding of the gallium nitride epitaxial structure to the carrier.

After the adhesive material has hardened, the gallium nitride substrate is stripped under the action of the opposing forces, and a part of the gallium nitride substrate above the decomposition layer and the gallium nitride epitaxial structure form the semiconductor device, and a part of the gallium nitride substrate below the decomposition layer is the stripped gallium nitride substrate, and the stripped gallium nitride substrate may still be used.

The stripped gallium nitride substrate has a relatively rough surface. In order to facilitate the next use, after obtaining the stripped gallium nitride substrate and the semiconductor device, the method further includes:

a separated surface of the stripped gallium nitride substrate is polished.

In some embodiments, the polishing method may be chemical mechanical polishing.

In this embodiment, after the stripped gallium nitride substrate and the semiconductor device are obtained at the same time, the semiconductor device may also be transferred to a flexible substrate for preparing an LED device, a power supply with lower power consumption, a radio frequency filter with higher frequency, etc. This embodiment provides a new process scheme for heterogeneous integration of a gallium nitride semiconductor device and different materials, may achieve reuse of a gallium nitride substrate, and has great potential especially in the field of manufacturing of radio frequency power amplifiers with high heat dissipation efficiency.

In some embodiments of the present disclosure, the gallium nitride substrate on which the gallium nitride epitaxial structure is grown is obtained when the gallium nitride substrate is stripped; then in a direction from the gallium nitride epitaxial structure to the gallium nitride substrate, the gallium nitride substrate is irradiated by the laser beam, and the pulse width of the laser beam is on the order of less than $10^{-15}$ s, the pulse width is extremely small, the peak power of the laser beam is extremely high, and the laser beam is accurately converged into the interior of the gallium nitride substrate, so that a thermal decomposition reaction occurs in the interior of the gallium nitride substrate, i.e. the focus of the laser beam, to generate the decomposition layer; and the gallium nitride substrate is separated at the decomposition layer, and since the distance between the decomposition layer and the upper surface of the gallium nitride substrate is less than the thickness of the gallium nitride substrate, the pure stripped gallium nitride substrate and the semiconductor device are obtained after separation. In some embodiments of the present disclosure, stripping of the gallium nitride substrate is achieved while the semiconductor device is obtained; furthermore, the stripped gallium nitride substrate is also continuously used for manufacturing a semiconductor device, so as to achieve reuse, thereby reducing the cost of the gallium nitride substrate when producing the semiconductor device. In addition, in some embodiments of the present disclosure, the gallium nitride epitaxial structure is grown on the gallium nitride substrate, and compared with a heterogeneous substrate such as sapphire, in some embodiments of the present disclosure, there is no lattice mismatch or thermal mismatch between the gallium nitride epitaxial structure and the gallium nitride substrate; therefore, in some embodiments of the present disclosure, the gallium nitride epitaxial structure has a relatively high quality. Since the manufacturing cost of a gallium nitride substrate is extremely high, application and development of a gallium nitride semiconductor device on the gallium nitride substrate are limited; however, the stripping method in some embodiments of the present disclosure solves this problem, and has very important significance.

On the basis of the embodiments above, in some embodiments of the present disclosure, before the interior of the gallium nitride substrate is scanned and irradiated via the gallium nitride epitaxial structure by a laser beam, the method further includes:

the gallium nitride epitaxial structure and the gallium nitride substrate are grooved by a laser grooving technique to form grooves, and depths of the grooves are equal to the distance between the decomposition layer and the upper surface of the gallium nitride epitaxial structure.

During grooving, the laser beam in step S102 is also used. When the laser beam performs scanning in the gallium nitride substrate, nitrogen is produced in addition to the decomposition layer, the gas produced by thermal decomposition of gallium nitride may be discharged from the grooves in time.

The plane on which the bottom of the grooves is located is also the surface on which the focus of the laser beam is focused in the gallium nitride substrate in step S102, and the distance from the bottom of the grooves to the upper surface of the gallium nitride substrate is equal to the distance between the decomposition layer and the upper surface of the gallium nitride substrate, and is also between 4 μm and 6 μm. The width of the grooves may be between 4 μm and 6 μm.

It should be noted that, in some embodiments of the present disclosure, the distribution form of the grooves is not limited, for example, the grooves may be distributed in a manner of a plurality of parallel lines, that is, the grooves are divided into a plurality of groove groups, and each of the groove group includes a plurality of grooves arranged at intervals in a direction in which the parallel lines are extending. Or the grooves may be distributed in a grid, which is more conducive to the discharge of the gas produced by thermal decomposition of gallium nitride.

When the grooves are distributed in a grid, the gallium nitride substrate and the gallium nitride epitaxial structure above the bottom of the grooves may be divided into a plurality of cells.

On the basis of any embodiments above, in some embodiments of the present disclosure, before the gallium nitride substrate with the gallium nitride epitaxial structure directly grown on the upper surface thereof is acquired, the method further includes:

the gallium nitride epitaxial structure is grown on the upper surface of the gallium nitride substrate.

Further, in some embodiments of the present disclosure, the specific structure of the gallium nitride epitaxial structure is not limited, and is determined according to the type of a semiconductor device.

As some embodiments, when the semiconductor device is a high-electron-mobility transistor, the gallium nitride epitaxial structure is directly grown on the upper surface of the gallium nitride substrate includes:

step S201: a high-resistance layer is grown on the upper surface of the gallium nitride substrate.

The material of the high-resistance layer is gallium nitride, and the thickness thereof is between 1 μm and 3 μm, including endpoint values, e.g., 1.5 μm, 2 μm, 2.5 μm, etc.

Methods for growing the high-resistance layer include, but are not limited to, a molecular beam epitaxy method, a vapor phase epitaxy method, and a metal-organic chemical vapor deposition method. In order to improve the deposition speed and performance of the high-resistance layer, the high-resistance layer is formed by the metal-organic chemical vapor deposition method.

Step S202: a high-mobility layer is grown on an upper surface of the high-resistance layer.

The material of the high-mobility layer is gallium nitride, and the thickness thereof is between 10 nm and 100 nm, including endpoint values, e.g., 20 nm, 30 nm, 40 nm, 50 nm, 60 nm, 70 nm, 80 nm, 90 nm, etc.

Methods for growing the high-mobility layer include, but are not limited to, a molecular beam epitaxy method, a vapor phase epitaxy method, and a metal-organic chemical vapor deposition method. In order to improve the deposition speed and performance of the high-mobility layer, the high-mobility layer is formed by the metal-organic chemical vapor deposition method.

Step S203: an insertion layer is grown on an upper surface of the high-mobility layer.

The material of the insertion layer is aluminum nitride.

Step S204: a barrier layer is grown on an upper surface of the insertion layer.

The material of the barrier layer is aluminum gallium nitride, and the thickness thereof is between 10 nm and 30 nm, including endpoint values, e.g., 15 nm, 20 nm, 25 nm, etc. A heterostructure material system formed by the aluminum gallium nitride barrier layer and the high-mobility layer has a large band offset and a strong polarization effect. Even without any doping, a two-dimensional electron gas density of up to about 1013 cm-2 may be produced in a quantum well at a heterogeneous interface merely by means of a polarization stress, and the composition of aluminum is between 0.10 and 0.35, including endpoint values, e.g., 0.15, 0.20, 0.25, 0.30, etc.

Methods for growing the barrier layer include, but are not limited to, a molecular beam epitaxy method, a vapor phase epitaxy method, and a metal-organic chemical vapor deposition method. In order to improve the deposition speed and performance of the barrier layer, the barrier layer is formed by the metal-organic chemical vapor deposition method.

Step S205: a capping layer is grown on an upper surface of the barrier layer.

The photon energy of the laser beam is less than the band gap of the barrier layer.

The material of the capping layer is gallium nitride, and the thickness thereof is between 1 nm and 5 nm, including endpoint values, e.g., 2 nm, 3 nm, 4 nm, etc.

Methods for growing the capping layer include, but are not limited to, a molecular beam epitaxy method, a vapor phase epitaxy method, and a metal-organic chemical vapor deposition method. Preferably, the capping layer is formed by the metal-organic chemical vapor deposition method, so as to improve the formation speed and performance of the capping layer.

The capping layer not only may achieve the effect of passivation, but also may keep channel electrons away from the surface of a device, and further reduce the influence of a surface state of the device on a channel current, thereby suppressing the current collapse effect.

The photon energy of the laser beam being less than the band gap of the barrier layer may avoid damage to the barrier layer caused by the laser beam, and improve the performance of the semiconductor device.

Figure 4:
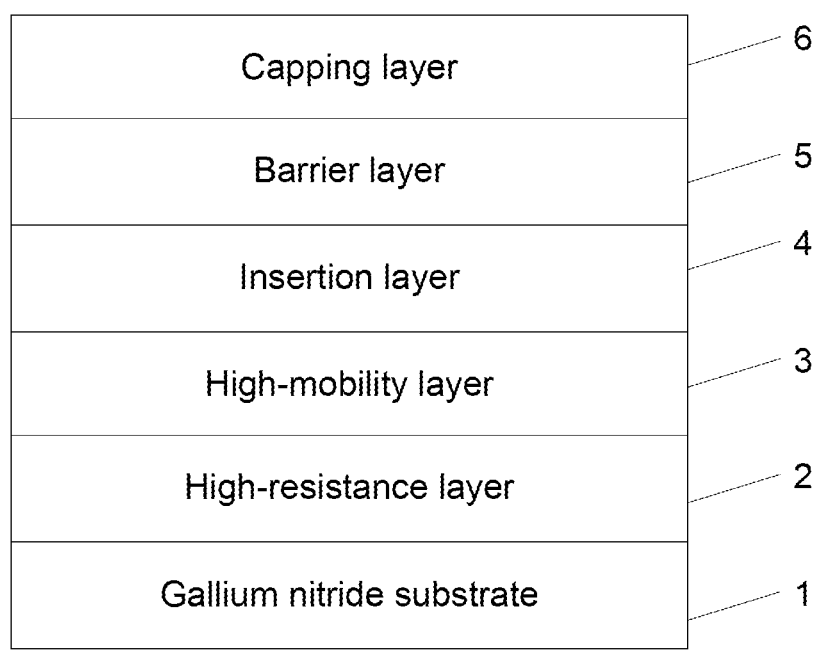
FIG. 4 is a schematic structural diagram of a high-electron-mobility transistor.

The schematic structural diagram of the high-electron-mobility transistor is as shown in FIG. 4, which sequentially includes a gallium nitride substrate 1, a high-resistance layer 2, a high-mobility layer 3, an insertion layer 4, a barrier layer 5, and a capping layer 6 from bottom to top. The high-electron-mobility transistor may also not be provided with the insertion layer 4.

When the semiconductor device is a metal-oxide semiconductor field effect transistor, the metal-oxide semiconductor field effect transistor includes a substrate, a source/drain region, a gate oxide layer and a gate. For the specific manufacturing process of the epitaxial structure, reference may be made to related technologies, and details will not be repeated herein.

When the semiconductor device is a fin field effect transistor, the fin field effect transistor includes a substrate, a shallow trench isolation (STI) layer, a buffer layer, a group III-V material, a dielectric layer, and an electrode. For the specific manufacturing process of the epitaxial structure, reference may be made to related technologies, and details will not be repeated herein.

The method for stripping the gallium nitride substrate will be described below by taking the semiconductor device being a high-electron-mobility transistor and the laser beam being a femtosecond laser beam as an example.

At step 1, a gallium nitride substrate having a hexagonal symmetrical structure is selected.

At step 2, a gallium nitride structure material is grown on the gallium nitride substrate by a metal-organic chemical vapor deposition method, and the gallium nitride structure material includes a gallium nitride high-resistance layer, a gallium nitride high-mobility layer, an aluminum nitride insertion layer, an aluminum gallium nitride barrier layer and a gallium nitride capping layer which are sequentially stacked from bottom to top.

At step 3, a femtosecond laser beam with the wavelength of 1030 nm is focused in the gallium nitride substrate via the gallium nitride structure material, grooves are formed by a laser grooving process, and the gallium nitride structure material are divided into cells of 500 microns×500 microns, and the width of the grooves is 5 μm, and the depth of the part of the grooves that is located in the gallium nitride substrate is 4-6 μm; and the pulse energy of the femtosecond laser beam is 3-5 μJ, the pulse repetition rate of the femtosecond laser beam is 1-2 kHz, and the scanning speed of the femtosecond laser beam is 500-1000 μm/s.

At step 4, the femtosecond laser beam is adjusted to incident from an upper surface of the gallium nitride structure material into the gallium nitride substrate, and the focus of the beam is located 4-6 μm below an upper surface of the gallium nitride substrate, and is parallel to the upper surface of the gallium nitride substrate; and the gallium nitride substrate is scanned along an S-shaped track until a continuous thin decomposition layer is generated 4-6 μm below the upper surface of the gallium nitride substrate. The photon energy of the laser light used needs to be less than the band gap of barrier layer material, and at this time, both the barrier layer material and the gallium nitride substrate are transparent (that is, will not be damaged) under the wavelength of the laser light; the wavelength of the femtosecond laser beam used is 1030 nm, the pulse width of the femtosecond laser beam used is 350 fs, the pulse repetition rate of the femtosecond laser beam used is 2.5 kHz, and the scanning speed of the femtosecond laser beam used is 1000 μm/s; and the pulse energy of the femtosecond laser beam is adjusted, such that the non-linear breakdown threshold is exceeded only in a focus region, and a gallium nitride material in the focus region is decomposed, and the pulse energy used for stripping is 0.2 μJ.

At step 5, a temporary adhesive material acting as a bonding material is coated on a front surface of a carrier by means of spin coating, and the rotational speed is 1200-3000 rpm/min, and the duration is 30-60 seconds.

At step 6, the gallium nitride substrate on which the gallium nitride structure material is grown is bonded to the front surface of the carrier, and a certain temperature and pressure are applied to achieve bonding; and after the temporary adhesive material has hardened, under the action of opposing forces, the gallium nitride substrate is separated at the decomposition layer to obtain a stripped gallium nitride substrate and a high-electron-mobility transistor. The stripped gallium nitride substrate may be reused after further chemical mechanical polishing.

Various embodiments in the description are described in a progressive manner. Each embodiment focuses on differences from other embodiments. For the same or similar parts among the embodiments, reference may be made to each other. For the apparatuses disclosed in the embodiments, as the apparatuses correspond to the methods disclosed in the embodiments, the illustration thereof is relatively simple, and for the related parts, reference may be made to the illustration of the method part.

Hereinabove, a method for stripping a gallium nitride substrate provided in some embodiments of the present disclosure is introduced in detail. The principle and embodiments of the present disclosure are described herein through specific examples, and the illustration of the embodiments above is only used to help understand the method and core ideas of some embodiments of the present disclosure. It should be pointed out that for a person of ordinary skill in the technical field, several improvements and refinements may be made without departing from the principle of the present disclosure, and these improvements and refinements shall also fall within the scope of protection of the present disclosure.

What is claimed is:

1. A method for stripping a gallium nitride substrate, comprising:
   acquiring a gallium nitride substrate with a gallium nitride epitaxial structure directly grown on an upper surface thereof;
   scanning and irradiating an interior of the gallium nitride substrate via the gallium nitride epitaxial structure by a laser beam, so as to generate a decomposition layer in the gallium nitride substrate, the laser beam being a laser having a pulse width on the order of less than $10^{-15}$s, and a distance between the decomposition layer and the upper surface of the gallium nitride substrate being less than a thickness of the gallium nitride substrate; and
   separating the gallium nitride substrate at the decomposition layer, so as to obtain a stripped gallium nitride substrate and a semiconductor device,
   wherein before scanning and irradiating the interior of the gallium nitride substrate via the gallium nitride epitaxial structure by the laser beam, the method further comprises:
   grooving the gallium nitride epitaxial structure and the gallium nitride substrate by a laser grooving technique to form grooves, depths of the grooves being equal to the distance between the decomposition layer and the upper surface of the gallium nitride epitaxial structure.

2. The method for stripping the gallium nitride substrate as claimed in claim 1, wherein the grooves are distributed in a grid.

3. The method for stripping the gallium nitride substrate as claimed in claim 1, wherein after obtaining the stripped gallium nitride substrate and the semiconductor device, the method further comprises:
   polishing a separated surface of the stripped gallium nitride substrate.

4. The method for stripping the gallium nitride substrate as claimed in claim 1, wherein separating the gallium nitride substrate at the decomposition layer comprises:
   bonding the upper surface of the gallium nitride epitaxial structure to a carrier; and
   applying opposing forces to the carrier and the gallium nitride substrate, so that the gallium nitride substrate is separated at the decomposition layer.

5. The method for stripping the gallium nitride substrate as claimed in claim 1, wherein a wavelength of the laser beam is between 1000 nm and 1040 nm, pulse energy of the laser beam is between 3 µJ and 5 µJ, a pulse repetition rate of the laser beam is between 1 kHz and 2 kHz, and a scanning speed of the laser beam is between 500 um/s and 1000 um/s.

6. The method for stripping the gallium nitride substrate as claimed in claim 1, wherein before acquiring the gallium nitride substrate with the gallium nitride epitaxial structure directly grown on the upper surface thereof, the method further comprises:
   growing the gallium nitride epitaxial structure on the upper surface of the gallium nitride substrate.

7. The method for stripping the gallium nitride substrate as claimed in claim 6, wherein growing the gallium nitride epitaxial structure on the upper surface of the gallium nitride substrate comprises:
   growing a first gallium nitride layer on the upper surface of the gallium nitride substrate;
   growing a second gallium nitride layer on an upper surface of the high-resistance layerfirst gallium nitride layer;
   growing an insertion layer on an upper surface of the second gallium nitride layer;
   growing a barrier layer on an upper surface of the insertion layer; and
   growing a capping layer on an upper surface of the barrier layer.

8. The method for stripping the gallium nitride substrate as claimed in claim 7, wherein material of the insertion layer is aluminum nitride, material of the barrier layer is aluminum gallium nitride, and material of the capping layer is gallium nitride.

9. The method for stripping the gallium nitride substrate as claimed in claim 7, wherein a thickness of the first gallium nitride layer is between 1 µm and 3 µm, a thickness of the second gallium nitride layer is between 10 nm and 100 nm, a thickness of the barrier layer is between 10 nm and 30 nm, and a thickness of the capping layer is between 1 nm and 5 nm.

10. The method for stripping the gallium nitride substrate as claimed in claim 7, wherein growing the first gallium nitride layer on the upper surface of the gallium nitride substrate comprises: forming the first gallium nitride layer on the upper surface of the gallium nitride substrate by a metal-organic chemical vapor deposition method;
   growing the second gallium nitride layer on the upper surface of the first gallium nitride layer comprises: forming the second gallium nitride layer on the upper surface of the first gallium nitride layer by a metal-organic chemical vapor deposition method; and growing the barrier layer on the upper surface of the insertion layer comprises:
forming the barrier layer on the upper surface of the insertion layer by a metal-organic chemical vapor deposition method.

11. The method for stripping the gallium nitride substrate as claimed in claim 7, wherein photon energy of the laser beam is less than a band gap of the barrier layer.

12. The method for stripping the gallium nitride substrate as claimed in claim 1, wherein under the condition of scanning and irradiating the gallium nitride substrate, the laser beam scans and irradiates the interior of the gallium nitride substrate in a continuous track.

13. The method for stripping the gallium nitride substrate as claimed in claim 7, wherein the continuous track is an S-shaped track or a spiral track.

14. The method for stripping the gallium nitride substrate as claimed in claim 1, wherein under the condition of scanning and irradiating the gallium nitride substrate, the laser beam scans and irradiates the interior of the gallium nitride substrate in a plurality of intermittent tracks.

15. The method for stripping the gallium nitride substrate as claimed in claim 14, wherein under the condition of scanning and irradiating the interior of the gallium nitride substrate in the plurality of intermittent tracks, the laser beam scans multiple times in a length direction or a width direction of the gallium nitride substrate.

16. The method for stripping the gallium nitride substrate as claimed in claim 14, wherein under the condition of scanning and irradiating the interior of the gallium nitride substrate in the plurality of intermittent tracks, a laser is turned off after scanning in each individual track is finished, and is then turned on to perform next scanning until scanning of the gallium nitride substrate is finished, the laser being used to emit the laser beam.

17. The method for stripping the gallium nitride substrate as claimed in claim 1, wherein a thickness of the stripped gallium nitride substrate is greater than 150 µm.

18. The method for stripping the gallium nitride substrate as claimed in claim 1, wherein a focus of the laser beam is parallel to the upper surface of the gallium nitride substrate.

19. The method for stripping the gallium nitride substrate as claimed in claim 1, wherein after obtaining the stripped gallium nitride substrate and the semiconductor device, the method further comprises: transferring the semiconductor device onto a flexible substrate.

20. The method for stripping the gallium nitride substrate as claimed in claim 1, wherein the grooves are distributed in a manner of a plurality of parallel lines.

* * * * *